(12) United States Patent
Fujimura et al.

(10) Patent No.: US 12,177,972 B2
(45) Date of Patent: Dec. 24, 2024

(54) HEAT-DISSIPATING CIRCUIT BOARD, HEAT-DISSIPATING MEMBER, AND PRODUCTION METHOD FOR HEAT-DISSIPATING CIRCUIT BOARD

(71) Applicant: NOF CORPORATION, Tokyo (JP)

(72) Inventors: Toshinobu Fujimura, Tsukuba (JP); Katsumi Nakasato, Tsukuba (JP); Muneaki Iizuka, Tsukuba (JP)

(73) Assignee: NOF CORPORATION, Tokyo (JP)

( * ) Notice: Subject to any disclaimer, the term of this patent is extended or adjusted under 35 U.S.C. 154(b) by 0 days.

(21) Appl. No.: 18/289,769

(22) PCT Filed: Aug. 23, 2022

(86) PCT No.: PCT/JP2022/031681
§ 371 (c)(1),
(2) Date: Nov. 7, 2023

(87) PCT Pub. No.: WO2023/032748
PCT Pub. Date: Mar. 9, 2023

(65) Prior Publication Data
US 2024/0268022 A1    Aug. 8, 2024

(30) Foreign Application Priority Data

Aug. 30, 2021   (JP) ................................ 2021-139948

(51) Int. Cl.
*B32B 3/00*      (2006.01)
*C23C 16/40*     (2006.01)
(Continued)

(52) U.S. Cl.
CPC .......... *H05K 1/053* (2013.01); *C23C 16/403* (2013.01); *C23C 16/4486* (2013.01);
(Continued)

(58) Field of Classification Search
CPC .... H05K 1/053; H05K 1/0209; H05K 1/0306; H05K 3/0061; H01L 21/4857; H01L 23/3735

See application file for complete search history.

(56) References Cited

U.S. PATENT DOCUMENTS

| 2018/0287169 A1 | 10/2018 | Yagyu et al. |
| 2018/0369861 A1 | 12/2018 | Katori et al. |

FOREIGN PATENT DOCUMENTS

| JP | 2012-212788 A | 11/2012 |
| JP | 2014-207490 A | 10/2014 |

(Continued)

OTHER PUBLICATIONS

International Search Report for PCT/JP2022/031681 dated Nov. 8, 2022 (PCT/ISA/210).

*Primary Examiner* — Elizabeth E Mulvaney
(74) *Attorney, Agent, or Firm* — Sughrue Mion, PLLC

(57) ABSTRACT

According to the present invention, a heat-dissipating circuit board is formed by providing a metal material adjacent to one surface of an insulating layer and providing a conductive metal layer to the other surface of the insulating layer. The metal material is a sheet of copper or a copper alloy or aluminum or an aluminum alloy and is 0.2-20 mm thick. The insulating layer is a metal oxide layer that has the composition AlxOyTz, is 0.2-30 μm thick, has a volume resistivity of at least 1000 GΩ·cm, and has a porosity of no more than 10%. The heat-dissipating circuit board has excellent heat-dissipation properties and insulation properties.

12 Claims, 1 Drawing Sheet

(51) Int. Cl.
  *C23C 16/448*   (2006.01)
  *H01L 21/48*    (2006.01)
  *H01L 23/373*   (2006.01)
  *H05K 1/02*     (2006.01)
  *H05K 1/05*     (2006.01)
  *H05K 3/44*     (2006.01)

(52) U.S. Cl.
  CPC ...... *H01L 21/4846* (2013.01); *H01L 23/3735* (2013.01); *H05K 1/0209* (2013.01); *H05K 3/44* (2013.01); *H05K 2201/0179* (2013.01); *H05K 2201/0191* (2013.01); *H05K 2203/088* (2013.01)

(56) References Cited

FOREIGN PATENT DOCUMENTS

| | | | | |
|---|---|---|---|---|
| JP | 2018-140352 | A | 9/2018 | |
| JP | 2018-157115 | A | 10/2018 | |
| JP | 2018-172793 | A | 11/2018 | |
| WO | 2017/110953 | A1 | 6/2017 | |
| WO | WO-2019189329 | A1 * | 10/2019 | ........... B32B 15/043 |

\* cited by examiner

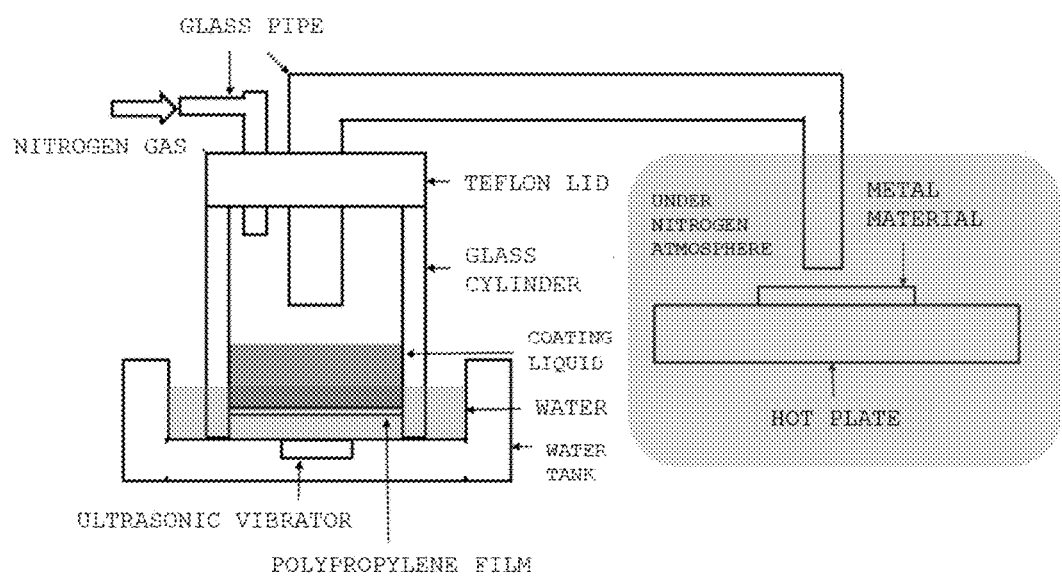

HEAT-DISSIPATING CIRCUIT BOARD, HEAT-DISSIPATING MEMBER, AND PRODUCTION METHOD FOR HEAT-DISSIPATING CIRCUIT BOARD

CROSS REFERENCE TO RELATED APPLICATIONS

This application is a National Stage of International Application No. PCT/JP2022/031681 filed Aug. 23, 2022, claiming priority based on Japanese Patent Application No. 2021-139948 filed Aug. 30, 2021.

TECHNICAL FIELD

The present invention relates to a heat-dissipating circuit board, a heat-dissipating member, and a production method for a heat-dissipating circuit board.

BACKGROUND ART

Conventionally, metal heat-dissipating members have been used to release heat generated by electronic parts such as semiconductor chips to the outside of the system. Some of these heat-dissipating members are provided with an insulating layer so as not to conduct electricity. As the insulating layer, ceramics formed of metal oxides, thermosetting resins, plastics, and the like are used. Among these, ceramics are excellent in heat resistance and insulation properties, but have a problem of not exhibiting sufficient thermal conductivity to dissipate heat generated by increases in currents typified by recent electric vehicles.

There are three main reasons why the thermal conductivity of ceramics is not sufficient. The first reason is that it is difficult to process ceramics to thin plates and to plates having a thickness of 150 μm or less by a thermal calcination method, the second reason is that the thermal conductivity of adhesives used to paste ceramics to metals decreases, and the third reason is that the ceramics formed by the thermal calcination method have fine air bubbles and the porosity is not low.

Therefore, in order to solve the problems, Patent Document 1 proposes a technique in which an insulating layer and an aluminum plate are directly joined to each other without an adhesive layer interposed therebetween by being pressed and brought into close contact with each other under heating. However, since the insulating layer is joined under heating and pressing, the insulating layer cracks in a case of being thin, so the thickness of the insulating layer is required to be 150 μm or more, and there is a problem that the thermal conductivity is poor.

Patent Document 2 proposes a metal base substrate in which an alumina layer as an insulating layer is formed on aluminum or an aluminum alloy. The patent document exemplifies a method of forming an alumina layer by anodic oxidation, but it is difficult to control the film thickness and the dielectric breakdown field intensity is insufficient in the anodic oxidation method, so the alumina layer is required to be 30 to 200 μm to maintain insulation properties. Since the alumina layer obtained by the anodic oxidation method has hexagonal columnar cavities, there is a problem that the porosity is high and the thermal conductivity is poor.

Patent Document 3 proposes an insulating substrate including an insulating film formed by thermally spraying ceramic powder onto the surface of a conductive base material. As for the thermal spraying method, since it is difficult to control the film thickness and there is a possibility that pinholes are formed in the insulating film, the thickness of the insulating film is required to be 80 to 300 μm, the porosity is also high, and the thermal conductivity is not sufficient.

Patent Document 4 proposes a method of forming a conductive metal oxide film on copper, its alloy, or the like. However, only conductive metal oxides are used to form a film, and there is no description regarding insulating films. In addition, there is no description regarding the porosity, density, or heat dissipation properties of the obtained metal oxide layer.

PRIOR ART DOCUMENT

Patent Documents

Patent Document 1: JP-A-2018-157115
Patent Document 2: JP-A-2012-212788
Patent Document 3: JP-A-2014-207490
Patent Document 4: JP-A-2018-172793

SUMMARY OF THE INVENTION

Problems to be Solved by the Invention

The present invention has been made in view of the above circumstances, and an object thereof is to provide a heat-dissipating circuit board excellent in heat dissipation properties and insulation properties, and further to provide a heat-dissipating member including the heat-dissipating circuit board and a production method for a heat-dissipating circuit board.

Means for Solving the Problems

[Clause 1] In other words, the present invention relates to a heat-dissipating circuit board including a metal material that is provided to be adjacent to one surface of an insulating layer and a conductive metal layer that is provided on the other surface of the insulating layer, in which a material of the metal material is copper or a copper alloy or aluminum or an aluminum alloy, and the metal material has a sheet shape with a thickness of 0.2 mm or more and 20 mm or less, and the insulating layer is a metal oxide layer that is represented by a compositional formula: $Al_xO_yT_z$ (where Al represents an aluminum atom, O represents an oxygen atom, T represents one atom or a plurality of atoms other than Al and O; x, y, and z denote a mass ratio, $x+y+z=100$, x is 30 or more and 60 or less, y is 40 or more and 70 or less, and z is 0 or more and 10 or less), and has a thickness of 0.2 μm or more and 30 μm or less, a volume resistivity of 1000 GΩ·cm or more, and a porosity of 10% or less.

[Clause 2] The present invention relates to the heat-dissipating circuit board according to clause 1, in which a surface roughness (Ra1) of the metal material on an insulating layer side is 1.0 μm or less, and a surface roughness (Ra2) of the insulating layer on a conductive metal layer side is 0.3 μm or less.

[Clause 3] The present invention relates to the heat-dissipating circuit board according to clause 1 or 2, in which a content of carbon atoms in the metal oxide layer 0.1% by mass or more and 5% by mass or less.

[Clause 4] The present invention relates to a heat-dissipating member obtained by bonding the metal material in the heat-dissipating circuit board according to any one of clauses 1 to 3 to a heat sink with an adhesive or grease.

[Clause 5] The present invention relates to a production method for the heat-dissipating circuit board according to any one of clauses 1 to 3, in which the insulating layer is formed by reacting a coating liquid containing a salt or complex of aluminum on the metal material for film formation.

[Clause 6] The present invention relates to the production method for a heat-dissipating circuit board according to clause 5, in which the film formation method is a method in which mist or droplets obtained by atomizing the coating liquid or forming the coating liquid into droplets are conveyed with a carrier gas, and then the mist or droplets are reacted on the metal material in a temperature atmosphere of 230° C. or more and 450° C. or less.

[Clause 7] The present invention relates to the production method for a heat-dissipating circuit board according to clause 5 or 6, in which the coating liquid contains an aluminum complex at 0.2% by mass or more and 20% by mass or less.

Effect of the Invention

The heat-dissipating circuit board of the present invention exhibits high heat dissipation properties and insulation properties since an insulating metal oxide layer having a thin film and a low porosity is formed (directly on) to be adjacent to a metal material, and heat easily moves between the metal material, which is a good conductor of heat, and the metal oxide layer.

The metal oxide layer, which is the insulating layer, is a thin film of 0.2 μm to 30 μm, but if the surface roughness (Ra1) of the metal material on the insulating layer side is less than 1.0 μm, the insulating layer (metal oxide layer) does not crack even when repeatedly exposed to high temperatures and exhibits excellent durability. Furthermore, if the surface roughness (Ra2) of the insulating layer on the conductive metal layer side is 0.3 μm or less, the conductive metal layer does not crack even when repeatedly exposed to high temperatures and exhibits excellent durability.

BRIEF DESCRIPTION OF THE DRAWINGS

The FIGURE is a schematic diagram of a film forming apparatus of an insulating layer in a production method for a heat-dissipating circuit board of the present invention.

MODE FOR CARRYING OUT THE INVENTION

<Heat-Dissipating Circuit Board>

In a heat-dissipating circuit board of the present invention, a metal material is provided to be adjacent to one surface of an insulating layer and a conductive metal layer is provided on the other surface of the insulating layer. The heat-dissipating circuit board is mainly used to dissipate heat generated from circuits, semiconductor chips, and the like, and includes the metal material, the insulating layer, and the conductive metal layer. The conductive metal layer is provided for an electrode of a semiconductor chip and the like, and the metal material is provided to dissipate heat generated from a semiconductor chip and the like. The insulating layer is provided to insulate the conductive metal layer and the metal material from each other.

<Metal Material>

The material of the metal material is copper or a copper alloy or aluminum or an aluminum alloy, and the metal material has a sheet shape with a thickness of 0.2 mm or more and 20 mm or less. The metal material and the insulating layer can exhibit high close contact properties as copper atoms or aluminum atoms in the metal material bond directly or via oxygen atoms to aluminum atoms in the insulating layer (metal oxide layer) at the interface with the insulating layer.

As the copper or copper alloy or aluminum or aluminum alloy, known one can be applied as long as it exhibits heat dissipation properties as a heat-dissipating circuit board. Examples of the copper or copper alloy include a compound represented by the compositional formula: $Cu_xM_yT_z$ (Cu represents a copper atom, M represents a chromium, beryllium, molybdenum, nitrogen, or phosphorus atom, and T represents one atom or a plurality of atoms other than Cu and M. x, y, and z denote a mass ratio, $x+y+z=100$, x is 60 or more and 100 or less, y is 0 or more and 40 or less, and z is 0 or more and 5 or less.). Here, it is more preferable as the number of copper atoms in the metal material is larger, and x is more preferably 80 or more and 100 or less in a case where high close contact properties are required.

Examples of the aluminum or aluminum alloy include a compound represented by the compositional formula: $Al_xM_yT_z$ (Al represents an aluminum atom, M represents a copper, magnesium, or nitrogen atom, and T represents one atom or a plurality of atoms other than Al and M. x, y, and z denote a mass ratio, $x+y+z=100$, x is 80 or more and 100 or less, y is 0 or more and 20 or less, and z is 0 or more and 3 or less.). Here, it is more preferable as the number of aluminum atoms in the metal material is larger, and x is more preferably 90 or more and 100 or less in a case where high close contact properties are required.

The compounds represented by the respective compositional formulas have a high thermal conductivity and are more suitable as heat-dissipating materials.

The metal material has a sheet shape with a thickness of 0.2 mm or more and 20 mm or less, preferably 0.5 mm or more and 20 mm or less. The heat dissipation performance is not sufficient in a case where the thickness of the metal material is thinner than 0.2 mm, and there is a disadvantage in the mounting process of the heat-dissipating circuit board when the thickness is thicker than 20 mm.

As for the metal material, the surface roughness (Ra1) of the metal material on the insulating layer side is preferably 1.0 μm or less, more preferably 0.8 μm or less. In a case where the surface roughness (Ra1) is greater than 1.0 μm, the insulating layer may crack when repeatedly exposed to high temperatures. In a case where heat resistance of 150° C. or more is desired, the surface roughness (Ra1) is more preferably 0.8 μm or less.

The metal material is preferably subjected to chemical and/or physical smoothing so that the surface roughness (Ra1) is 1.0 μm or less. More preferably, since microscopic chemical changes of the metal material surface adversely affect the close contact properties with the metal oxide layer, physical smoothing is preferable. Examples of physical smoothing include buffing to which abrasive grains are added.

Here, the surface roughness (Ra1) is "arithmetic mean roughness" and refers to a value calculated by measurement using a contact-type surface roughness meter, a laser microscope, an atomic force microscope, or the like. The same applies to the surface roughness (Ra2) to be described later.

<Insulating Layer>

The insulating layer of the present invention is a metal oxide layer that is represented by a compositional formula: $Al_xO_yT_z$ (where Al represents an aluminum atom, O represents an oxygen atom, T represents one atom or a plurality of atoms other than Al and O. x, y, and z denote a mass ratio, x+y+z=100, x is 30 or more and 60 or less, y is 40 or more and 70 or less, and z is 0 or more and 10 or less.), and has a thickness of 0.2 μm or more and 30 μm or less, a volume resistivity of 1000 GΩ·cm or more, and a porosity of 10% or less.

If the metal oxide layer is a metal oxide layer that is an oxide of aluminum and represented by the compositional formula, in many cases, the volume resistivity becomes 1000 GΩ·cm or more, but x is preferably 40 or more and preferably 57 or less, y is preferably 43 or more and preferably 60 or less, and z is preferably 0.1 or more and preferably 8 or less from the viewpoint of enhancing insulation properties and thermal conductivity. In a case where z is smaller than 0.1, the metal oxide film becomes too hard, and the metal oxide layer is likely to crack when distortion occurs in the heat-dissipating circuit board. When z is greater than 8, insulation properties may be impaired when a voltage greater than 400 V is applied. From the viewpoint of preventing a decrease in volume resistivity due to impurities, T is preferably a carbon atom, a hydrogen atom, a nitrogen atom, a phosphorus atom, a sulfur atom, a halogen atom, or a combination thereof.

The insulating layer has a thickness of 0.2 μm or more and 30 μm or less, and preferably has a thickness of 0.8 μm or more and 30 μm or less in a case where higher insulation properties are required. The insulation performance is poor if the thickness is thinner than 0.2 μm, and the insulating layer may crack when heated to 100° C. or more if the thickness is thicker than 30 μm.

The insulating layer has a volume resistivity of 1000 GΩ·cm or more when a DC voltage of 400 V is applied. Hence, electricity at a level at which the circuit undergoes a short circuit at a voltage of 400 V or less does not flow between the conductive metal layer and the metal material. The insulating layer preferably has a volume resistivity of 2000 GΩ·cm (2 TΩ·cm) or more, more preferably 80000 GΩ·cm (80 TΩ·cm) or more.

The insulating layer has a porosity of 10% or less. The insulating layer has a porosity of preferably 5% or less, more preferably 3% or less, still more preferably 1% or less from the viewpoint of enhancing heat dissipation properties. Here, porosity is a measured value sometimes called pore rate, and is the volume ratio of space occupied by gas in the metal oxide layer. When voids, cracks, voids, and the like are generated in the insulating layer, the value of porosity increases. As the method for measuring porosity, the Archimedes method, mercury porosimetry, and gravimetric porosimetry are known, and the method is not particularly limited. However, the above-described measurement methods cannot be applied to measure a porosity of 10% or less like the insulating layer (metal oxide layer) of the present invention. For this reason, the porosity of 10% or less is determined from the following equation after an electron micrograph of the insulating layer (metal oxide layer) is taken and the area (S1) of the insulating layer (total area of metal oxide and voids) and the area of the space (S2) in the same electron micrograph are calculated.

$$\text{Porosity} = S2 * 100/S1 \, (\%)$$

As for the insulating layer, the surface roughness (Ra2) of the insulating layer on the conductive metal layer side is preferably 0.3 μm or less, more preferably 0.1 μm or less. In a case where the surface roughness (Ra2) is greater than 0.3 μm, the conductive metal layer may crack when repeatedly exposed to high temperatures. In a case where heat resistance of 150° C. or more is desired, the surface roughness (Ra2) is more preferably 0.1 μm or less.

The content of carbon atoms in the metal oxide layer is preferably 0.1% by mass or more, more preferably 0.2% by mass or more from the viewpoint of enhancing close contact properties to the metal material and flexibility while maintaining heat dissipation properties and insulation properties. When the content of carbon atoms is lower than 0.1% by mass, the metal oxide layer becomes hard, and when the heat-dissipating circuit board is bent, the close contact properties and flexibility may not be sufficient and the circuit board may crack. The content of carbon atoms is more preferably 5% by mass or less, more preferably 3% by mass or less. When the content of carbon atoms exceeds 3% by mass, insulation properties may be impaired when a voltage of 400 V or more is applied. The content of carbon atoms in the metal oxide layer can be measured by dynamic SIMS.

The method for forming the insulating layer (metal oxide layer) is not particularly limited, and examples thereof preferably include physical vapor deposition methods such as vacuum evaporation, ion plating, and sputtering, chemical vapor deposition methods such as plasma CVD, atomic layer deposition (ALD), organometallic CVD, and mist CVD, and coating methods in which a coating liquid is reacted on the metal material, such as spraying, ink jetting, spin coating, and dip coating in order to achieve a porosity of 10% or less and a volume resistivity of 1000 GΩ·cm or more. Among these, chemical vapor deposition methods and coating methods are preferable since the methods are excellent in film formation speed and uniform film formation.

In the chemical vapor deposition methods and coating methods, it is preferable that a metal oxide layer is formed by heating and reacting a coating liquid containing a salt or complex of aluminum on a metal material in a temperature atmosphere of 230° C. or more and 450° C. or less since copper atoms or aluminum atoms in the metal material bond to aluminum atoms in the insulating layer directly or via oxygen bonds, the adhesion and close contact properties at the interface are enhanced. When the temperature for film formation exceeds 450° C., the thermal load on the metal material is large and the dimensional stability of the obtained heat-dissipating circuit board deteriorate as well as the difference in coefficient of thermal expansion between the metal material and the insulating layer is large and the metal oxide layer may crack after the temperature thereof is returned to room temperature.

In particular, a method (hereinafter abbreviated as mCVD) is most preferable in which when a coating liquid is heated and reacted on a metal material, mist or droplets obtained by atomizing or misting the coating liquid are conveyed onto the metal material with a carrier gas such as nitrogen and then a film is formed by heating and reacting the mist or droplets on the metal material in a temperature atmosphere of 230° C. or more and 450° C. or less. This method is one kind of chemical vapor deposition method. In this way, by forming a coating liquid containing a salt or complex of aluminum into fine droplets and reacting the fine droplets to form a film on a metal material having a thin and uniform film thickness, a porosity of 3% or less, and a surface roughness (Ra1) of 1.0 μm or less, a metal oxide layer having a surface roughness (Ra2) of 0.3 μm or less is obtained. According to this method, since the reactivity of the aluminum salt or aluminum complex in the coating liquid is increased by atomization or misting, the metal oxide layer can be obtained at a temperature of 230° C. or more and 450° C. or less, so a film can be formed without deteriorating the metal material, and a metal oxide layer having a high volume resistivity is obtained. By forming a film by mCVD in a temperature region of 230° C. or more and 450° C. or less, it is possible to control the content of carbon atoms in the metal oxide layer in the range of 0.1% by mass or more and 5% by mass or less. As for mCVD and its apparatus, for example, JP-A-2018-140352, JP-A-2018-172793, and the like can be referred to.

The coating liquid preferably contains an aluminum complex at 0.2% by mass or more and 20% by mass or less. The time for film formation increases when an aluminum complex is contained at less than 0.2% by mass, and the surface roughness (Ra2) of the metal oxide layer may increase when an aluminum complex is contained at more than 20% by mass.

In the mCVD, it is preferable to form a film in an environment containing oxygen at 1% or less in order to suppress oxidation of the metal. Water is preferably used as the oxidizing source to prevent ignition of the atomized coating liquid. Here, the oxidizing source is a supply source of oxygen atoms for converting an aluminum salt or aluminum complex into alumina.

In this way, by forming a coating liquid containing a salt or complex of aluminum into fine droplets and then reacting the fine droplets on a metal material, it is also possible to fill concaves and convexes on the surface of the metal material.

<Conductive Metal Layer>

The material for the conductive metal layer of the present invention is not particularly limited as long as it is a metal commonly used as an electrode. Examples of the materials for the conductive metal layer include copper, silver, chromium, ITO, and IZO. The thickness of the electrode is not particularly limited, and may be, for example, 0.5 μm or more and 0.5 mm or less.

In the heat-dissipating circuit board, it is required that the conductive metal layer and the metal material are not electrically connected, and as a confirmation method thereof, it is considered to be favorable if a current of 1 mA or more does not flow when a DC voltage of 5 V is applied to the metal material and the conductive metal layer.

The method for forming the conductive metal layer is not particularly limited, and examples thereof include a method in which a copper foil processed into a circuit shape is pasted, etching into a circuit shape is performed after plating, or etching into a circuit shape is performed after conductive metal layer deposition.

An adhesive layer, an anchor layer, and the like may be provided between the insulating layer and the conductive metal layer, if necessary.

The heat-dissipating circuit board of the present invention is preferably used as a heat-dissipating member in which the metal material is bonded to a heat sink using an adhesive or grease in a case where higher heat dissipation properties are desired. As the adhesive or grease, it is preferable to use highly thermal conductive one.

As the general method of using the heat-dissipating circuit board of the present invention, a heat generator such as a semiconductor chip that generates heat when electrified is provided on the conductive metal layer, and heat generated by the heat generator is dissipated to the metal material via the insulating layer (metal oxide layer).

EXAMPLES

Hereinafter, the present invention will be described more specifically with reference to Examples and Comparative Examples.

Production Example

<Preparation of Coating Liquid>

Coating liquids were prepared using the raw materials and blending ratios (% by mass) presented in Table 1.

TABLE 1

|  | Coating liquid A | | Coating liquid B | | Coating liquid C | | Coating liquid D | |
| --- | --- | --- | --- | --- | --- | --- | --- | --- |
|  | Name of substance | Parts by mass (%) | Name of substance | Parts by mass (%) | Name of substance | Parts by mass (%) | Name of substance | Parts by mass (%) |
| Aluminum salt/ complex | Al(acac)3 | 2 | Al(iPr)2Eacac | 0.5 | Al(Eacac)3 | 8 | Al(Eacac)2acac | 4 |
| Oxygen source | Water | 10 | Water | 10 | Water | 20 | Water | 10 |
| Solvent | Acetonitrile | 88 | Methanol | 89.5 | Methanol | 72 | Methanol | 86 |

In Table 1, Al (acac)3 denotes aluminum tris(acetylacetonate) ("Aluminum Chelate A", manufactured by Kawaken Fine Chemicals Co., Ltd.);

Al (iPr)2Eacac denotes aluminum ethyl acetoacetate diisopropylate ("ALCH", manufactured by Kawaken Fine Chemicals Co., Ltd.);

Al (Eacac)3 denotes aluminum tris(ethyl acetoacetate) ("ALCH-TR", manufactured by Kawaken Fine Chemicals Co., Ltd.); and Al (Eacac)2acac denotes aluminum monoacetylacetonate bis(ethyl acetoacetate) ("Aluminum Chelate D", manufactured by Kawaken Fine Chemicals Co., Ltd.).

EXAMPLE 1

<Formation of Insulating Layer (Metal Oxide Layer)>

Using the film forming apparatus (mCVD apparatus) illustrated in the FIGURE, an insulating layer (metal oxide layer) was formed on a metal material by the following method. A polypropylene film was fixed at a position 1 cm from the bottom of a glass cylinder (13 cm in diameter and 15 cm in height) with an O-ring and a caulking agent. A Teflon (Registered trademark) lid was provided on the top of the cylinder, and two holes were made in the lid to insert glass pipes for supplying nitrogen gas and for conveying mist. The glass tube for conveying mist was installed at a distance of 1 cm to 2 cm from the metal material on the hot plate. The cylinder was immersed in a water bath, and an ultrasonic vibrator (Ultrasonic Atomizer Unit HMC-2401; manufactured by HONDA ELECTRONICS CO., LTD.) was installed directly below the polypropylene. The hot plate was installed in a box filled with nitrogen, and the oxygen concentration was controlled at 1% or less. The coating liquid was put into the cylinder, the ultrasonic vibrator was activated, ultrasonic waves were transmitted to the coating liquid via the water in a water tank and the polypropylene, and a portion of the coating liquid was atomized. The atomized coating liquid was transported onto the metal material (30 mm×30 mm) by nitrogen gas. The metal material was heated by the hot plate, and the atomized coating liquid was chemically reacted on the metal material to form a metal oxide layer, whereby a laminate was obtained. The film thickness of the metal oxide layer was adjusted by the time for film formation (the time during which the atomized coating liquid was sprayed onto the metal material) and measured by the following method. The nitrogen gas flow rate was 6 L/min, the frequency of the ultrasonic vibrator was 2.4 MHz, the voltage was 24 V, and the current was 0.6 A. Table 2 shows the conditions such as the used metal materials, coating liquids, hot plate temperatures, and the like.

<Measurement of Film Thickness of Metal Oxide Layer>

The film thickness of the metal oxide layer was measured using a reflectance spectroscopic film thickness meter (F20; manufactured by Filmetrics Japan, Inc.) after a metal oxide layer was formed on chromium glass instead of the metal material mentioned above. It was assumed that the metal oxide layer formed on the chromium glass and the metal oxide layer formed on the metal material had the same thickness. However, in Examples 6, 7, 9, and 13 and Comparative Examples described below, the metal oxide layer was not transparent, so a cross section was formed by an ion milling method, a micrograph was taken using a scanning electron microscope, and the film thickness was measured.

<Measurement of Surface Roughness of Metal Material and Metal Oxide Layer>

The surface roughness (Ra1) of the metal material and the surface roughness (Ra2) of the metal oxide layer were measured using a contact-type surface roughness meter (DektakXT-S; manufactured by Bruker Japan K.K.). The surface roughness was measured by 0.5 mm at the central portion of the base material, and the arithmetic mean roughness was calculated.

<Measurement of Composition of Metal Oxide Layer>

The masses of aluminum atoms, oxygen atoms, and carbon atoms per unit volume and their ratios were calculated by dynamic SIMS. PHI ADEPT (manufactured by ULVAC-PHI, Inc.) was used as a measuring instrument, $Cs^+$ was used as the primary ion species, the primary accelerating voltage was 5.0 kV, and the detection region was 45×45 μm. As the sample, one in which a metal oxide was formed on glass by 1 μm was prepared. The measurement was performed at central portion of the sample in the depth direction, and the point where silicon was detected was defined as a depth of 1 μm. From the secondary ionic strength, relative sensitivity coefficient, and atomic weight of each of aluminum, oxygen, and carbon atoms, the mass ratio among the three atoms was calculated. Since there was not a difference of 1% or more between the total value of the three atomic masses per unit volume and the specific gravity of the metal oxide layer, the mass ratio among the three atoms per unit volume was calculated as the composition ratio assuming that the metal oxide layer is mainly composed of the three atoms.

The following evaluation was performed using the laminates obtained above.

<Close Contact Properties>

Close contact properties were evaluated by the presence or absence of peeling off between the metal material and the metal oxide after a cold and heat resistance test. Specifically, using a TSA-103ES-W thermal shock testing machine manufactured by ESPEC Co., Ltd., the 30 mm×30 mm laminate was subjected to 100 cycles of cold and heat resistance test in which one cycle consisted of cooling at −40° C. for 35 minutes and heating at 200° C. for 35 minutes. The laminate after the test was visually observed, and those without peeling off were evaluated as "○", those without peeling off but with cracking were evaluated as "Δ", and those with peeling off were evaluated as "x".

<Insulation Properties>

A circular main electrode having a diameter of 10 mm as a conductive metal layer was formed on the metal oxide layer of the 30 mm×30 mm laminate using a silver paste (DOTITE FA-451A; manufactured by Fujikura Kasei Co., Ltd.), whereby a heat-dissipating circuit board was fabricated. Using the obtained heat-dissipating circuit board, the volume resistivity was measured by applying a DC voltage of 400 V to between the metal material and the main electrode and measuring the current using 5450 High Resistance Meter manufactured by ADC Corporation. Those having a volume resistivity of 2000 GΩ·cm or more were evaluated as "○", those having a volume resistivity of 1000 GΩ·cm or more and less than 2000 GΩ·cm were evaluated as "Δ", and those having a volume resistivity of less than 1000 GΩ·cm were evaluated as "x".

<Porosity>

A cross section of the metal oxide layer was formed by an ion milling method, and a micrograph of 500 nm×500 nm or more was obtained. The area (S1=500 nm×500 nm) of the insulating layer (total area of metal oxide and voids) in the micrograph and the area of space (S2) in the same electron micrograph were calculated, and the porosity was determined from the following equation. As for the area of space, the areas of all spaces of which long sides were 10 nm or more were calculated and summed.

$$\text{Porosity} = S2 * 100/S1\ (\%)$$

Those having a porosity of 10% or less were evaluated as "○", and those having a porosity of more than 10% were evaluated as "x".

<Thermal Conductivity (Heat Dissipation Properties)>

In a dry glove box purged with nitrogen contained in a cylinder, about 10 grains of ammonium acetate (melting point: 112° C.) that was not deliquesced were placed on the metal oxide layer of the 30 mm×30 mm laminate, and the laminate was put on a hot plate at 120±3° C. with the metal material facing down. An enlarged picture of the manner in which ammonium acetate was melting was taken using a CCD camera, and the time T1 from when the laminate was placed on the hot plate until the ammonium acetate completely became liquid was measured. Those having the time T1 of 120 seconds or less were evaluated as "○", those having the time T1 of less than 120 seconds and 150 seconds or less were evaluated as "Δ", and those having the time T1 of more than 150 seconds were evaluated as "x".

<Confirmation of Formation of Conductive Metal Layer>

A silver paste (DOTITE FA-451A; manufactured by Fujikura Kasei Co., Ltd.) was printed near the center of the metal oxide layer by screen printing in a size of 2 mm×20 mm (thickness: 20 to 30 μm), heated at 150° C. for 30 minutes, and then further heated at 200° C. for 24 hours to form an electrode as a conductive metal layer, whereby a heat-dissipating circuit board was fabricated. A voltage of 5 V was applied to both ends of the long side of the electrode, and the electrical resistance was measured. Those having an electrical resistance of 5×10⁻³ Ω·cm or less were evaluated as "○", and those having an electrical resistance of more than $5\times10^{-3}$ Ω·cm were evaluated as "x". It was evaluated as "x" in a case where cracking occurred in the electrode as well. It was evaluated as "Δ" in a case where cracking of the conductive metal layer was visually confirmed although the electrical resistance was $5\times10^{-3}$ Ω·cm or less.

<Confirmation of Electrical Connection Between Conductive Metal Layer and Metal Material>

Using the heat-dissipating circuit board obtained above, a voltage of 5 V was applied to the electrode formed with a silver paste and the metal material, and those in which the current flowed was 1 mA or less were evaluated as "○", and those in which the current flowed was more than 1 mA were evaluated as "x".

Examples 2 to 12 and 14

Laminates were fabricated by the same operation as in Example 1 except that the conditions for forming the insulating layer (metal oxide layer) in Example 1 were changed to the conditions presented in Table 2, and subjected to the evaluation described above. The results are presented in Table 2.

Example 13

With reference to the collection of chemical engineering papers, "Manufacture and reaction rate analysis of alumina thin films by CVD methods" (1998, Vol. 24, No. 1, p. 81-85), a laminate was fabricated by forming a metal oxide layer on a metal material using aluminum triisopropoxide as a raw material using an inner heat type CVD apparatus, and subjected to the evaluation described above. Here, the time for film formation was 90 minutes, the temperature for film formation was 630° C., and the oxygen flow rate was 6 L/min. The metal material after film formation formed copper oxide and turned black, and a large number of cracks were visually observed in the metal oxide layer.

TABLE 2

| Example | 1 | 2 | 3 | 4 | 5 | 6 | 7 | 8 | 9 |
|---|---|---|---|---|---|---|---|---|---|
| Kind of metal material | Copper | | | | | | | Aluminum | |
| Composition of metal material (%) | Cu = 100 | | | | | | | Al = 100 | |
| Surface roughness of metal material (Ra1: μm) | 0.05 | 0.05 | 0.3 | 0.4 | 0.05 | 0.3 | 0.6 | 0.15 | 0.13 |
| Metal material thickness (mm) | 0.5 | 1.5 | 5.0 | 20.0 | | 1.5 | | 1.5 | 20.0 |
| Coating liquid | A | A | A | A | B | D | C | A | A |
| Hot plate temperature (° C.) | 370 | 370 | 370 | 370 | 410 | 310 | 390 | 370 | 370 |
| Composition of metal oxide layer (Al/O/C) | | 50.8/48.0/1.2 | | | 51.2/48.6/0.2 | 49.8/47.7/2.5 | 50.6/48.8/0.6 | 50.8/48.0/1.2 | |
| Time for film formation (min) | | 21 | | | 62 | 51 | 130 | 21 | 51 |
| Surface roughness of metal oxide (Ra2) | 0.01 | 0.01 | 0.12 | 0.21 | 0.02 | 0.08 | 0.11 | 0.05 | 0.03 |
| Metal oxide film thickness (μm) | | 1.0 | | | 0.3 | 5.0 | 25 | 1.5 | 5.0 |
| Close contact properties | ○ | ○ | ○ | ○ | ○ | ○ | ○ | ○ | ○ |
| Insulation properties | ○ | ○ | ○ | ○ | ○ | ○ | ○ | ○ | ○ |
| Insulation properties (numerical value: TΩcm) | 17000 | 16000 | 12000 | 10000 | 15000 | 14000 | 15000 | 15000 | 12000 |
| Porosity | ○ | ○ | ○ | ○ | ○ | ○ | ○ | ○ | ○ |
| Porosity (numerical value: %) | 0 | 0 | 0 | 0 | 0 | 0 | 0 | 0 | 0 |
| Thermal conductivity | ○ | ○ | ○ | ○ | ○ | ○ | ○ | ○ | ○ |
| Thermal conductivity (numerical value: s) | 18 | 35 | 15 | 15 | 12 | 33 | 56 | 30 | 63 |
| Formation of conductive layer | ○ | ○ | ○ | ○ | ○ | ○ | ○ | ○ | ○ |
| Electrification of conductive layer | ○ | ○ | ○ | ○ | ○ | ○ | ○ | ○ | ○ |

| Example | 10 | 11 | 12 | 13 | 14 |
|---|---|---|---|---|---|
| Kind of metal material | Cu60Mo40 | Al96Mg4 | AlCu5C0.3 | Copper | |
| Composition of metal material (%) | Cu/Mo = 60/40 | Al/Mg = 96/4 | Al/Cu/C = 94.7/5/0.3 | Cu = 100 | |
| Surface roughness of metal material (Ra1: μm) | 0.1 | 0.1 | 0.1 | 0.05 | 1.5 |
| Metal material thickness (mm) | | | 1.5 | 1.5 | 0.5 |
| Coating liquid | A | A | A | — | A |
| Hot plate temperature (° C.) | 370 | 370 | 370 | 630 | 370 |
| Composition of metal oxide layer (Al/O/C) | | 50.8/48.0/1.2 | | 53.1/46.9/0 | 50.8/48.0/1.2 |
| Time for film formation (min) | | 21 | | 90 | 21 |
| Surface roughness of metal oxide (Ra2) | 0.08 | 0.10 | 0.11 | 0.26 | 1.2 |
| Metal oxide film thickness (μm) | | 1.5 | | 12 | 1.0 |

TABLE 2-continued

| | | | | | |
|---|---|---|---|---|---|
| Close contact properties | ○ | ○ | ○ | Δ (cracking) | ○ |
| Insulation properties | ○ | ○ | ○ | ○ | ○ |
| Insulation properties (numerical value: TΩcm) | 18000 | 12000 | 11000 | 15000 | 17000 |
| Porosity | ○ | ○ | ○ | ○ | ○ |
| Porosity (numerical value: %) | 0 | 0 | 0 | 8 | 0 |
| Thermal conductivity | ○ | ○ | ○ | ○ | ○ |
| Thermal conductivity (numerical value: s) | 15 | 22 | 8 | 108 | 18 |
| Formation of conductive layer | ○ | ○ | ○ | ○ | Δ |
| Electrification of conductive layer | ○ | ○ | ○ | ○ | ○ |

Comparative Example 1

A circuit board was obtained with reference to Example 1 of Patent Document 1. Specifically, an aluminum metal material (30 mm×30 mm) having a thickness of 0.4 mm and an aluminum nitride (AlN) metal oxide substrate (ceramic substrate; 30 mm×30 mm) having a thickness of 635 μm were stacked with a brazing filler metal foil (thickness 12 μm) formed of Al-7.5 mass % Si alloy interposed therebetween, and joined by being heated and pressed using a hot press in an atmosphere of 630° C. and 6.0×10$^{-4}$ Pa. The obtained circuit board was subjected to the evaluation described above. The results are presented in Table 3.

Comparative Example 2

A circuit board was obtained with reference to Example 1 of Patent Document 2. Specifically, a thermosetting resin composed of a bisphenol A epoxy resin and 3- or 4-methyl-1,2,3,6-tetrahydrophthalic anhydride was applied onto one surface of an aluminum metal material (30 mm×30 mm) having a thickness of 0.3 mm by 20 μm, and cured by being heated at 230° C. for 3 hours. After that, the surface not coated with the thermosetting resin was anodized in an oxalic acid aqueous solution to obtain an 80 μm alumite layer. The thickness of the alumite layer was determined by forming a cross section by an ion milling method, taking a micrograph using a scanning electron microscope, and measuring the film thickness. The obtained circuit board was subjected to the evaluation described above. The results are presented in Table 3.

Comparative Example 3

A circuit board was obtained with reference to Patent Document 3. Specifically, alumina powder (6103; manufactured by METCO) was thermally sprayed on one surface of a copper metal material (30 mm×30 mm) having a thickness of 0.5 mm at 1650° C. so that the metal oxide layer had a thickness of 95 μm. The thickness of the thermally sprayed layer was determined by forming a cross section by an ion milling method, taking a micrograph using a scanning electron microscope, and measuring the film thickness. The obtained circuit board was subjected to the evaluation described above. The results are presented in Table 3.

Comparative Example 4

A circuit board was obtained with reference to Example 1 of Patent Document 4. Specifically, a metal oxide layer was formed on one surface of a SUS316 metal material (30 mm×30 mm) having a thickness of 0.5 mm using a 1 wt % acetylacetonate tin (II) aqueous solution (referred to as coating liquid E in Table 3) as the coating liquid at a hot plate temperature of 450° C. using the film forming apparatus used in Example 1. The thickness of the metal oxide layer was determined by forming a cross section by an ion milling method, taking a micrograph using a scanning electron microscope, and measuring the film thickness. The obtained circuit board was subjected to the evaluation described above. The results are presented in Table 3.

Comparative Example 5

A laminate was fabricated by the same operation as in Example 1 except that the conditions for forming the insulating layer (metal oxide layer) in Example 1 were changed to the conditions presented in Table 3, and subjected to the evaluation described above. The results are presented in Table 3.

TABLE 3

| Comparative Example | 1 | 2 | 3 | 4 | 5 |
|---|---|---|---|---|---|
| Kind of metal material | Aluminum | Aluminum | Copper | SUS316 | |
| Composition of metal material (%) | Al = 100 | Al = 100 | Cu = 100 | Fe/Cr/Ni/Mo = 67.5/18/12/2.5 | |
| Surface roughness of metal material (Ra1: μm) | 0.14 | 0.15 | 0.05 | 7.4 | 1.5 |
| Metal material thickness (mm) | 0.4 | 0.3 | 0.5 | 0.5 | 0.5 |
| Coating liquid | | | | E | A |
| Hot plate temperature (° C.) | | | | 450 | 370 |
| Metal oxide layer | AlN | Alumina | Alumina | SnO2 | $Al_xO_yT_z$ |
| Composition of metal oxide layer (Al/O/C) | Al/N = 67/33 | 57.3/42.7/0 | 54.2/45.8/0 | — | 50.8/48.0/1.2 |

TABLE 3-continued

| Comparative Example | 1 | 2 | 3 | 4 | 5 |
|---|---|---|---|---|---|
| Time for film formation (min) | | | | 33 | 21 |
| Surface roughness of metal oxide (Ra2) | 8.2 | 0.14 | 35 | 0.5 | 1.2 |
| Metal oxide film thickness (μm) | 635 | 80 | 95 | 7.4 | 1.0 |
| Film formation method | Hot pressing | Anodic oxidation | Thermal spraying | mCVD | mCVD |
| Close contact properties | ○ | ○ | ○ | ○ | X |
| Insulation properties | ○ | Δ | ○ | X | ○ |
| Insulation properties (numerical value: TΩcm) | 1500 | 1.1 | 200 | 0.0000001 | 16000 |
| Porosity | X | X | X | ○ | ○ |
| Porosity (numerical value: %) | 36 | 18 | 45 | 0 | 0 |
| Thermal conductivity | X | X | X | X | X |
| Thermal conductivity (numerical value: s) | 850 | 250 | 380 | 240 | 250 |
| Formation of conductive layer | ○ | ○ | ○ | X Cracking of electrode | X Cracking of electrode |
| Electrification of conductive layer | ○ | ○ | ○ | X | ○ |

Comparative Example 1 is a heat-dissipating circuit board fabricated by a hot pressing method, which is common as a production method for heat-dissipating circuit boards. The insulating layer of the heat-dissipating circuit board obtained in Comparative Example 1 had a low porosity and was thick, and the thermal conductivity was lower than those in Examples.

Comparative Example 2 is a heat-dissipating circuit board fabricated by an anodic oxidation method. The heat-dissipating circuit board obtained in Comparative Example 2 not only exhibited lower insulation properties but also exhibited insufficient heat dissipation properties as compared with those of Examples.

Comparative Example 3 is a heat-dissipating circuit board fabricated by a thermal spraying method. The heat-dissipating circuit board obtained in Comparative Example 3 had a low porosity and was thick, and the thermal conductivity was lower than those in Examples.

Comparative Example 4 is a heat-dissipating circuit board fabricated by an mCVD method. The heat-dissipating circuit board obtained in Comparative Example 4 did not exhibit sufficient insulation properties or thermal conductivity since the composition of the insulating layer and the kind of base material were outside the scope of the claims of the present patent. Since the surface roughness (Ra1) of the base material was also large, cracking occurred in the electrode during formation of the conductive metal layer.

Comparative Example 5, like Comparative Example 4, is a heat-dissipating circuit board fabricated by an mCVD method, to which the insulating layer of the present invention is applied. The insulation properties were higher than those in Comparative Example 4, but the close contact properties were low due to poor compatibility with the base material and the thermal conductivity was also low. Since the surface roughness (Ra1) of the base material was also large, cracking occurred in the electrode during formation of the conductive metal layer.

The invention claimed is:

1. A heat-dissipating circuit board comprising a metal material that is provided to be adjacent to one surface of an insulating layer and a conductive metal layer that is provided on the other surface of the insulating layer, wherein a material of the metal material is copper or a copper alloy or aluminum or an aluminum alloy, and the metal material has a sheet shape with a thickness of 0.2 mm or more and 20 mm or less, and the insulating layer is a metal oxide layer that is represented by a compositional formula: $Al_xO_yT_z$, (where Al represents an aluminum atom, O represents an oxygen atom, T represents one atom or a plurality of atoms other than Al and O; x, y, and z denote a mass ratio, $x+y+z=100$, x is 30 or more and 60 or less, y is 40 or more and 70 or less, and z is 0 or more and 10 or less), and has a thickness of 0.2 μm or more and 30 μm or less, a volume resistivity of 1000 GΩ·cm or more, and a porosity of 10% or less.

2. The heat-dissipating circuit board according to claim 1, wherein a surface roughness (Ra1) of the metal material on an insulating layer side is 1.0 μm or less, and a surface roughness (Ra2) of the insulating layer on a conductive metal layer side is 0.3 μm or less.

3. The heat-dissipating circuit board according to claim 1, wherein a content of carbon atoms in the metal oxide layer is 0.1% by mass or more and 5% by mass or less.

4. A heat-dissipating member obtained by bonding the metal material in the heat-dissipating circuit board according to claim 1 to a heat sink with an adhesive or grease.

5. A production method for the heat-dissipating circuit board according to claim 1, wherein the insulating layer is formed by reacting a coating liquid containing a salt or complex of aluminum on the metal material for film formation.

6. The production method for a heat-dissipating circuit board according to claim 5, wherein the film formation method is a method in which mist or droplets obtained by atomizing the coating liquid or forming the coating liquid into droplets are conveyed with a carrier gas, and then the mist or droplets are reacted on the metal material in a temperature atmosphere of 230° C. or more and 450° C. or less.

7. The production method for a heat-dissipating circuit board according to claim 5, wherein the coating liquid contains an aluminum complex at 0.2% by mass or more and 20% by mass or less.

8. The heat-dissipating circuit board according to claim 2, wherein a content of carbon atoms in the metal oxide layer is 0.1% by mass or more and 5% by mass or less.

9. A heat-dissipating member obtained by bonding the metal material in the heat-dissipating circuit board according to claim 2 to a heat sink with an adhesive or grease.

10. A production method for the heat-dissipating circuit board according to claim 2, wherein the insulating layer is formed by reacting a coating liquid containing a salt or complex of aluminum on the metal material for film formation.

11. The production method for a heat-dissipating circuit board according to claim 10, wherein the film formation method is a method in which mist or droplets obtained by atomizing the coating liquid or forming the coating liquid into droplets are conveyed with a carrier gas, and then the mist or droplets are reacted on the metal material in a temperature atmosphere of 230° C. or more and 450° C. or less.

12. The production method for a heat-dissipating circuit board according to claim 10, wherein the coating liquid contains an aluminum complex at 0.2% by mass or more and 20% by mass or less.

* * * * *